(12) United States Patent
Sidhu et al.

(10) Patent No.: US 8,177,348 B2
(45) Date of Patent: May 15, 2012

(54) DIRECT WRITE AND ADDITIVE MANUFACTURING PROCESSES

(75) Inventors: Jagjit Sidhu, Bristol (GB); Jennifer Laura McDonald, Bristol (GB)

(73) Assignee: BAE Systems plc, London (GB)

( * ) Notice: Subject to any disclaimer, the term of this patent is extended or adjusted under 35 U.S.C. 154(b) by 852 days.

(21) Appl. No.: 12/226,825

(22) PCT Filed: May 30, 2008

(86) PCT No.: PCT/GB2008/050390
§ 371 (c)(1), (2), (4) Date: Oct. 28, 2008

(87) PCT Pub. No.: WO2008/146047
PCT Pub. Date: Dec. 4, 2008

(65) Prior Publication Data
US 2010/0171792 A1    Jul. 8, 2010

(30) Foreign Application Priority Data

Jun. 1, 2007 (EP) .................................. 07270028
Jun. 1, 2007 (GB) ................................. 0710415.1

(51) Int. Cl.
*B41J 2/01* (2006.01)
(52) U.S. Cl. ....................................... 347/102; 347/101
(58) Field of Classification Search .................. 347/15, 347/43–44, 51–53, 101, 102, 104–105
See application file for complete search history.

(56) References Cited

U.S. PATENT DOCUMENTS

| | | | |
|---|---|---|---|
| 3,705,819 A | 12/1972 | Heller et al. | |
| 4,278,702 A | 7/1981 | Jenq | |
| 6,168,269 B1 * | 1/2001 | Rasmussen et al. | 347/102 |
| 6,401,001 B1 | 6/2002 | Jang et al. | |
| 6,405,095 B1 | 6/2002 | Jang et al. | |
| 2002/0105080 A1 | 8/2002 | Speakman | |
| 2003/0148024 A1 | 8/2003 | Kodos et al. | |
| 2005/0015175 A1 | 1/2005 | Huang | |
| 2005/0037614 A1 | 2/2005 | Fukuchi | |
| 2006/0176350 A1 * | 8/2006 | Howarth et al. | 347/102 |

FOREIGN PATENT DOCUMENTS

DE    101 55 713 A1    5/2003
(Continued)

OTHER PUBLICATIONS

European Patent Office, International Preliminary Report on Patentability and Written Opinion, Dec. 10, 2009, from International Patent Application No. PCT/GB2008/050390, filed on May 30, 2008.
European Patent Office, Search Report, Dec. 14, 2007 in connection with European Patent Application No. 07270028.9-1253.
U.K. Intellectual Property Office, Search Report, Aug. 29, 2007, in connection with UK Patent Application No. GB 0710415.1, filed Jun. 1, 2007.

*Primary Examiner* — Thinh Nguyen
(74) *Attorney, Agent, or Firm* — Kenyon & Kenyon LLP

(57) ABSTRACT

A Direct Write method of forming components on a substrate by deposition of ink by thermally curing the ink in situ, which method overcomes the need for curing by placing the substrate in an oven. The curing is performed in an exemplary embodiment using an induction coil (6) through which an oscillating current is passed. The coil (6) is placed above the region in which Direct Write ink has been deposited. The oscillating current induces eddy currents in the ink to cause heating of the ink and thus fix the ink by curing, sintering etc.

29 Claims, 4 Drawing Sheets

FOREIGN PATENT DOCUMENTS

| | | |
|---|---|---|
| EP | 1 613 136 A1 | 1/2006 |
| GB | 2 330 331 A | 4/1999 |
| WO | WO 02/47447 A1 | 6/2002 |
| WO | WO 03/032084 A2 | 4/2003 |

* cited by examiner

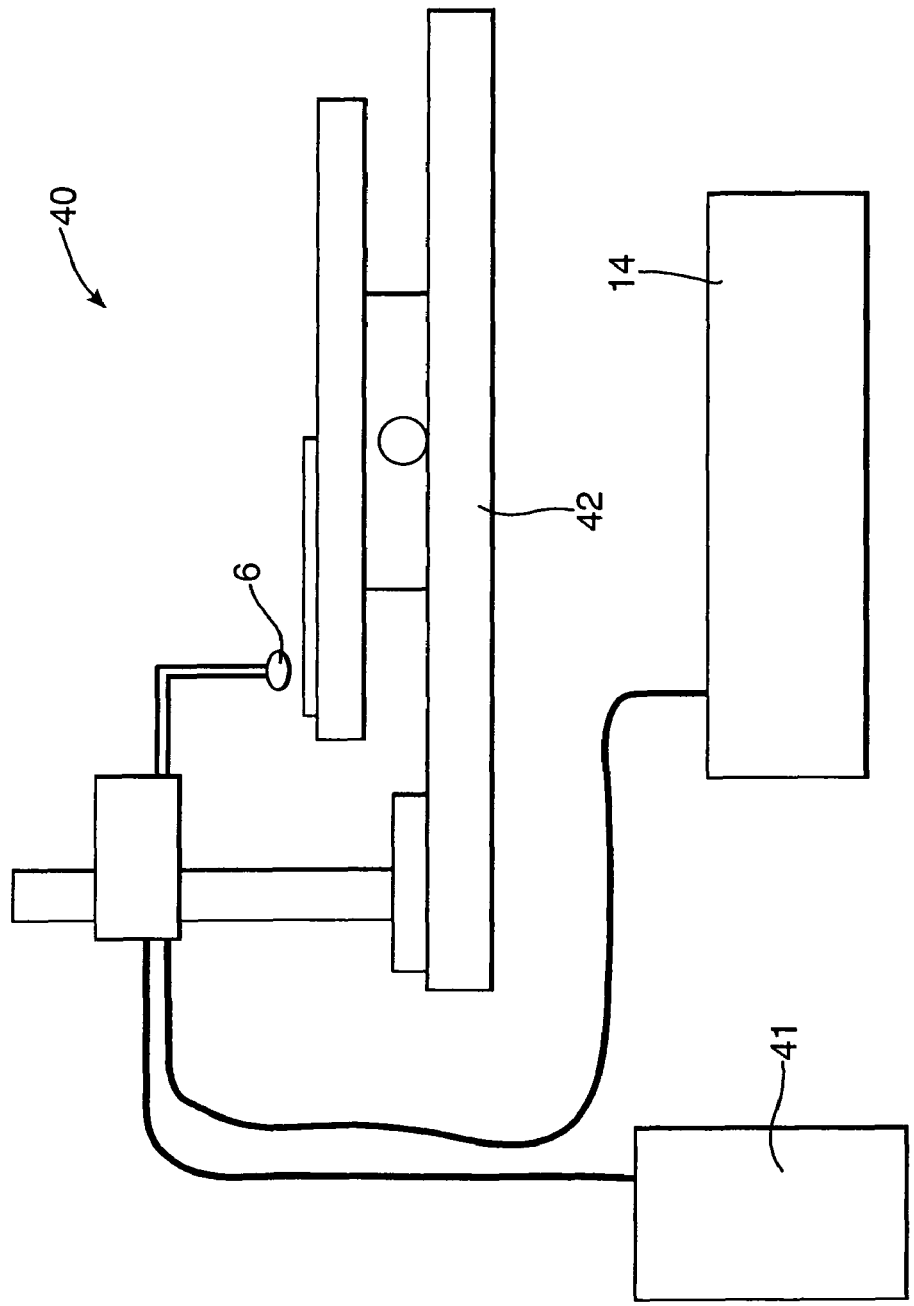

DIRECT WRITE AND ADDITIVE MANUFACTURING PROCESSES

RELATED APPLICATION INFORMATION

This application is a United States National Phase Patent Application of International Patent Application No. PCT/GB2008/050390 which was filed on May 30, 2008, and claims priority to British Patent Application No. 0710415.1, filed on Jun. 1, 2007, and claims priority to European Patent Application No. 07270028.9, filed on Jun. 1, 2007, the disclosures of each of which are incorporated herein by reference.

FIELD OF THE INVENTION

The present invention concerns improvements relating to Direct Write processes and additive manufacturing processes.

BACKGROUND INFORMATION

The term Direct Write is commonly used to describe a range of technologies which allows the fabrication of two or three-dimensional functional structures using processes that are compatible with being carried out directly onto potentially large complex shapes (DTI Report February 2004 "Direct Writing"). Direct Write manufacturing techniques include: Ink jet, Micro-spray, Quill, Pen, Aerosol, Pulsed laser evaporation, and Laser direct etching. Direct Write has the ability to fabricate active and passive functional devices directly onto structural parts and assemblies. The benefits of utilizing these techniques are increased functionality, reduced size and weight, reduced cost, design simplification, reduction in component number and a reduction in time to market. In the field of Aerospace, there are applications for Direct Write such as electronic circuits, sensors, RF devices, displays, stealth materials, meta-materials, packaging, sensors and harnesses.

Additive manufacturing is a generic term used to describe a process by which successive layers of a structure, device or mechanism are formed, and in which in each layer components such as electrical circuit components may be formed by a Direct Write method. The term "additive" is used to contrast conventional manufacturing processes such as lithography, milling, turning etc, in which material from a solid layer or object is taken away or removed.

In general, in Direct Write and additive manufacturing processes, writing or printing materials are referred to as inks, although the actual form of the material may comprise a wide range of powders, suspensions, plasters, colloids, solutes, vapors etc, which may be capable of fluid flow and which may be applied in pastes, gels, sprays, aerosols, liquid droplets, liquid flows, etc. Once applied, the material may be fixed by curing, consolidating, sintering or allowing to dry, frequently involving application of heat to change the state of the material to a solid phase. For the purposes of the present specification, the term "Direct Write ink" is intended to cover all such materials.

The object or structure (which may be a very large three-dimensional object) on which the deposition is performed is referred to in the art by the term "substrate", and this is the sense of the term as used in the present specification. The deposited ink, once fixed on the substrate; forms a component or part of a structure that is to be manufactured.

With almost all deposition methods used for Direct Write, after deposition the inks have to be cured, consolidated or sintered. There are inks for which this can be done with optical radiation but for most high performance inks this is done thermally by placing the substrate in an oven. This method has numerous deficiencies:

Curing temperature for the inks is limited by the substrate operating temperature. Generally the higher the temperature at which the inks are cured, the better the performance. Thus curing at a lower temperature limited by the substrate compromises the ink performance, and limits the range of ink chemistries that can be used.

There may be other elements on the substrate whose performance would be impaired by the elevated temperature they would be exposed to during a curing cycle.

If the substrate is large it may not be practical to place it in the oven for curing.

Invariably, printing requires multiple layers of printing and generally each layer has to be thermally consolidated prior to the deposition of the subsequent layer. If this is done by placing the substrate in the oven after each layer is printed, then there can be problems in registration accuracy when the substrate is tooled for printing. Ensuring accurate registration after each curing step in the oven also requires complex and costly tooling.

When depositing multiple layers, the removal and subsequent realignment of the substrate for curing in the oven is a costly and time consuming step.

US-A-2005/0015175 and US-A-6405095 mention the possibility, among other possibilities, of using an induction coil to effect fixing.

The present invention aims to overcome or at least substantially reduce some of the above discussed drawbacks.

SUMMARY OF THE INVENTION

The present invention overcomes the need in a Direct Write process of placing a substrate in an oven, by instead thermally curing the Direct Write ink in situ. The curing may be performed in an exemplary embodiment using an induction coil through which an oscillating current is passed. The coil is placed above the region to be cured. The oscillating current induces charge movement (eddy currents) in the region to be cured and the resistance to this charge movement causes Joule heating in the affected area and thus curing and sintering the inks. The current required for curing will depend on the dimensions of the area to be cured and its electrical and thermal properties, and will thus vary depending on the specifics of the application. A problem with other curing methods that may use localized radiation (such as laser or lamp radiation) is that it is difficult to ascertain when curing has been completed or indeed what the state of the inks being cured is. An additional advantage of this invention, at least in an exemplary embodiment, is that there may be a degree of self control and inherent process monitoring; as the curing progresses the resistance of the inks decreases and thus the rate of curing may decrease. This effect may be monitored and curing automatically adjusted as the curing progresses.

The present invention in an exemplary embodiment may include the use of an induction coil. Although the process is most suitable for metals, it could be used with Direct Write inks forming plastics and other electrically poor conductors or insulators by seeding the inks with conducting particles such as carbon or metal particles, or by secondary heating whereby the metal in the substrate or an inter-metallic layer is heated by conduction and this heat transferred to the insulating/plastic ink. The process is suitable for Direct Write where the inks are used to print electrical and sensor materials, and in additive manufacturing processes often referred to as ALM (additive layered manufacturing), rapid prototyping, and rapid manufacturing, where powder or other Direct Write inks are used to build layer by layer structural components. One of the significant control parameters is the height of the coil above the features to be cured. This may be done inherently by monitoring the capacitance between the coil and the ink being cured.

In a first aspect, the present invention provides a Direct Write method of forming a component of a structure on a substrate, including: applying a Direct Write ink onto a predetermined region of said substrate and positioning an inductive heating arrangement adjacent to said region having said Direct Write ink applied, and passing an electrical current through said inductive heating arrangement such as to heat said region by electromagnetic inductive effects, in order to fix said Direct Write ink.

In a second aspect, the present invention provides a Direct Write method of forming a component of a structure on a substrate, including: applying a Direct Write ink onto a predetermined region of said substrate in the form of a line or at least one line, and positioning an inductive heating arrangement adjacent to said region having said Direct Write ink applied, and passing an electric current through said inductive heating arrangement such as to heat said region by electromagnetic inductive effects, in order to fix said Direct Write ink, wherein the magnetic flux produced by said inductive heating arrangement has an effective diameter at the substrate generally equal to the width of a said line.

In a third aspect the present invention provides a Direct Write method of forming a component of a structure on a substrate, including: applying a Direct Write ink onto a predetermined region of said substrate in the form of a line or a plurality of lines, and positioning an inductive heating arrangement adjacent to said region having said Direct Write ink applied, and passing an electric current through said inductive heating arrangement such as to heat said region by electromagnetic inductive effects, in order to fix said Direct Write ink, wherein the height of the inductive heating arrangement above the Direct Write ink applied is controlled for controlling the amount of magnetic flux applied to the substrate.

In a further aspect, the present invention provides apparatus for a Direct Write process of forming a component on a substrate, including: an ink deposition arrangement for applying a Direct Write ink onto a region of a substrate, and an inductive heating arrangement for positioning adjacent said region such as to heat said region by electromagnetic inductive effects, in order to fix said Direct Write ink.

In addition, the invention extends to an additive manufacturing process for forming a structure by means of a plurality of layers deposited on a substrate, wherein at least one of the manufacturing layers is formed with the aforesaid Direct Write method.

Advantageously, it has been found the present invention has application to additive manufacturing processes where the substrate is a structural component having a flat surface or having a conformal surface, by which is meant a surface curved in two directions. The heating of Direct Write ink applied to a conformal surface by means of an induction coil permits localization of the heating to the region in which ink has been applied, but since the induction coil is spaced from the substrate, the coil may follow the non-linear shape of the surface.

The present invention also resides in an apparatus for a Direct Write process of forming a component on a substrate, including: an ink deposition arrangement for applying a Direct Write ink onto a region of a substrate in the form of at least one line and an inductive heating arrangement for positioning adjacent said region such as to heat said region by electromagnetic inductive effects, in order to fix said Direct Write ink, wherein the magnetic flux produced by said inductive heating arrangement has an effective diameter at the substrate generally equal to the width of a said line.

The present invention also resides in an apparatus for a Direct Write process of forming a component on a substrate, including: an ink deposition arrangement for applying a Direct Write ink onto a region of a substrate in the form of a line or a plurality of lines, and an inductive heating arrangement for positioning adjacent said region such as to heat said region by electromagnetic inductive effects, in order to fix said Direct Write ink, including an arrangement for adjusting the height of the inductive heating arrangement above the substrate by monitoring the capacitance between the inductive heating arrangement and the deposited Direct Write ink.

The components formed by a Direct Write process may typically be tracks or lines, which are long in relation to their width and height above the substrate. Such tracks or lines may form electrical interconnects, electrical resistive or reactive components, or passive components such as filters. Where areas of deposited ink are required, for example rectangular capacitance pads, these may be formed by deposition of a large number of parallel lines, closely spaced or touching one another. Alternatively, the lines may be distributed over a surface in such a way as to give the surface desired electromagnetic reflective and absorbent characteristics.

In general, the width of tracks formed by a Direct Write process depend on various factors, including inherent ink and substrate characteristics such as viscosity, surface writing temperature, as well as the process parameters of pressure, nozzle size, tip to substrate offset and processing speed.

In practice, the width of the tracks may be less than about 5 mm, for example between 3 and 5 mm. However the width may be decreased to any desired value, depending mainly on the nozzle diameter and the distance of the nozzle from the substrate. Currently a minimum width of about 50 microns may be envisaged.

Conductive tracks may be built up from a series of parallel tracks of much smaller width. For example, a 5 mm wide track may be formed from 5 narrow tracks 900 mm wide.

The width of a track deposited by Direct Write is a key parameter in determining the dimension of an induction coil for heating the track, since the magnetic flux generated may cover the whole width of the track. Equally a coil lo which produces substantial flux outside the width of the track will be wasteful of energy and may interfere with neighbouring structures.

Therefore an induction coil of small diameter may be provided, comparable to track width. If tracks are formed as a series of parallel lines, the coil may have a diameter comparable to the width of an individual line. In an exemplary embodiment, a cylindrical coil is vertically disposed above a track so as to produce a strong flux density at its end adjacent the track. The coil may be formed in a U shape so that both ends are positioned adjacent the track. Flux focusing elements such as ferromagnetic core elements may be employed. However any shape or configuration of coil may be used as desired, e.g. toroidal, flat.

The spacing of the coil above the track is also recognized to be a key factor, and a spacing of less than about 50 microns is desirable. A capacitance bridge may be employed to sense the spacing.

The amount of heating produced in the track will depend on the electrical resistance of the ink. Typically inks will have an initial resistance >100's$\Omega$/m, but as curing takes place this will decrease, and with suitable curing conditions this can be reduced to <1 Ω/m. The track dimensions (height, width) of the deposited ink will also have a direct effect on resistance. For electrical interconnects, a resistance of 3.5 Ω/m is typical.

The present invention extends to a method of forming a component of a structure on a substrate, including: applying an ink onto a predetermined region of said substrate and positioning an inductive heating arrangement adjacent to said region having said ink applied, and passing an electrical current through said inductive heating arrangement such as to heat said region by electromagnetic inductive effects, in order to fix said ink.

The present invention further extends to a method of forming a component of a structure on a substrate, including: applying an ink onto a predetermined region of said substrate in the form of a line or at least one line, and positioning an inductive heating arrangement adjacent to said region having said ink applied, and passing an electric current through said inductive heating arrangement such as to heat said region by electromagnetic inductive effects, in order to fix said ink, wherein the magnetic flux produced by said inductive heating arrangement has an effective diameter at the substrate generally equal to the width of a said line.

The present invention further extends to a method of forming a component of a structure on a substrate, including: applying an ink onto a predetermined region of said substrate in the form of a line or a plurality of lines, and positioning an inductive heating arrangement adjacent to said region having said ink applied, and passing an electric current through said inductive heating arrangement such as to heat said region by electromagnetic inductive effects, in order to fix said ink, wherein the height of the inductive heating arrangement above the ink applied is controlled for controlling the amount of magnetic flux applied to the substrate.

The present invention further extends to apparatus for any of the above described methods of forming a component of a structure on a substrate.

BRIEF DESCRIPTION OF THE DRAWINGS

FIG. 4 is a schematic diagram of apparatus incorporating an inductive heating coil according to another embodiment of the invention.

DETAILED DESCRIPTION

Exemplary embodiments of the present invention will now be described in more detail, by way of example only, with reference to the accompanying drawings.

Figure 1:
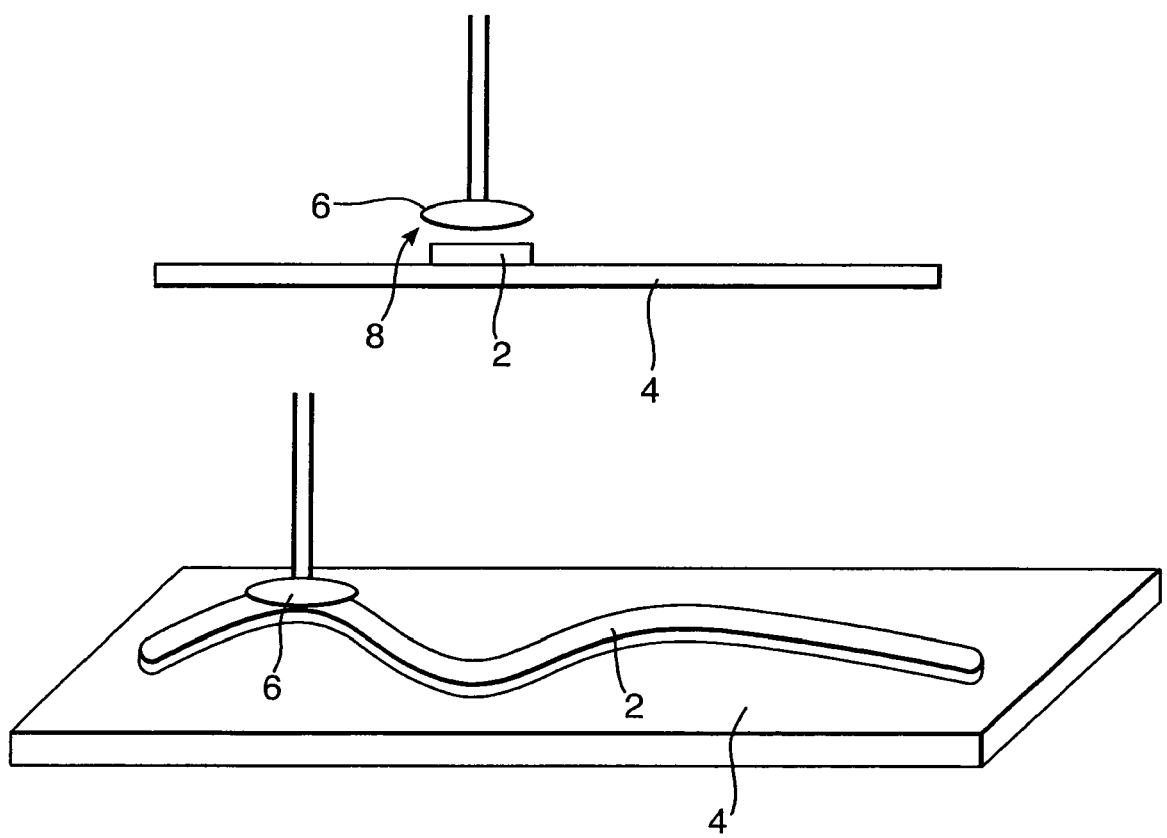
FIG. 1 is a schematic diagram showing the principle of operation of the present invention.

Referring first to FIG. 1, there is shown a schematic diagram which demonstrates the principle of operation of the invention. As shown in this Figure, Ink 2 to be cured is deposited on a substrate 4 (which can be flat or curved). The ink 2 to be cured is then scanned over with an induction coil 6, following the printed/deposition features of the ink. The gap 8 between the ink 2 and the coil 6 and the scanning speed are controlled to provide optimum heating. The coil 6 can be attached to a deposition head so that it automatically and immediately follows the deposition so that deposition and curing is done in a single step. Alternatively, the curing step can be isolated from the deposition step and the coil scans the deposited area independently of the deposition head.

Figure 2:
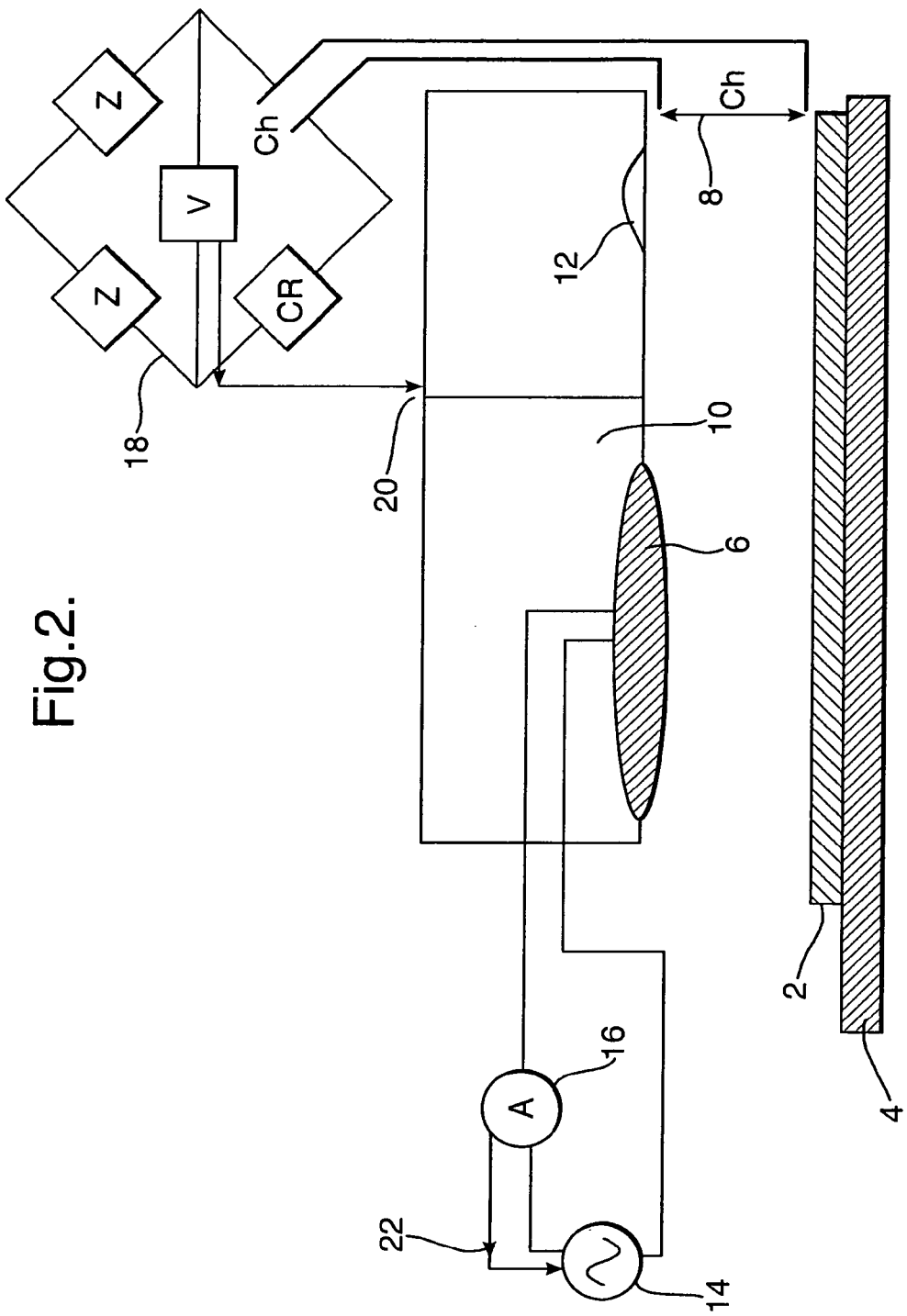
FIG. 2 is a schematic diagram of a print head for a Direct Write process incorporating an inductive heating coil according to an embodiment of the invention.

Referring now to FIG. 2, there is shown a schematic diagram of a print head for a Direct Write process incorporating an inductive heating coil according to an embodiment of the invention. This embodiment broadly corresponds to that of FIG. 1 and so corresponding reference numerals are used for corresponding parts. Similarly, corresponding parts are not described in detail in order to avoid repetition. As shown in FIG. 2, induction coil 6 is formed as a flat coil in a printed circuit, and is affixed to the underside of a deposition head 10 of a Direct Write ink jet mechanism. Head 10 includes a nozzle 12 for emitting a Direct Write ink (which could be in the form of a vapor, particles, jet, or a liquid extrusion). A source of alternating current 14 is coupled to the coil 6, and an ammeter 16 is used to monitor the current through the coil 6. As shown, the gap 8 of the print head 10 and coil 6 above the ink 2 has an associated capacitance Ch, dependent on the height of the head. This capacitance value Ch is measured in a capacitance bridge 18, against a reference capacitance CR (as shown in FIG. 2). A resulting voltage V is employed to adjust the height of the head by a suitable mechanism 20. Capacitance value Ch provides a means of monitoring the height of the head 10 for ensuring optimum deposition and heating. Measurement of the heating current provides a means of controlling the overall heating of the deposited ink, as schematically indicated at 22, since as the ink changes to a solid phase, the impedance of the ink to current flow will change and therefore the heating current will change accordingly. Depending on the precise ink and line characteristics, the resistance or reactance of the ink line may decrease (or increase).

Figure 3:
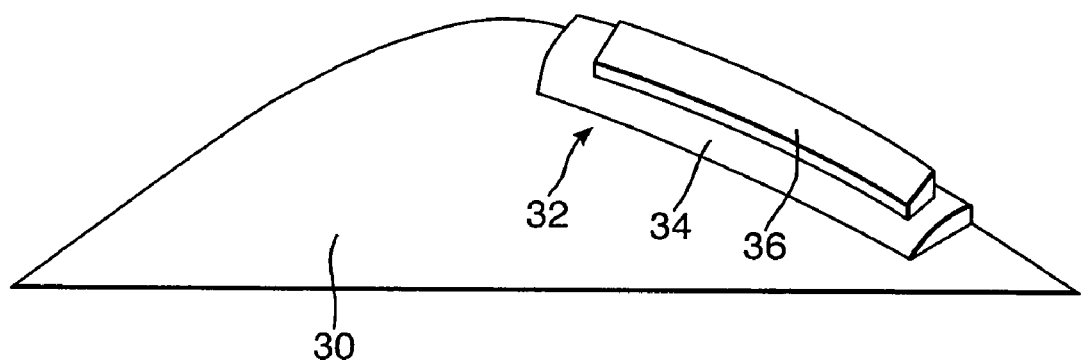
FIG. 3 is a schematic diagram of a structural component curved in two directions and having formed thereon electrical components by an additive manufacturing process embodying the present invention.

Referring to FIG. 3, this shows a structure produced by an additive manufacturing process, wherein a substrate 30 including a large three-dimensional component has a conformal surface, curved in two directions. An electronic structure 32 is formed on the substrate (only partly shown in FIG. 3), which includes an insulating layer component 34 formed directly on the surface, and a conductive layer component 36 formed on the insulating layer.

Components 34 and 36 are formed in successive layers, each by a process including a Direct Write step, using the print head of FIG. 2. Since the print head is spaced from the substrate surface, the complex curvature of the surface does not interfere with either the ink deposition process or the subsequent heating and curing of the ink.

EXAMPLE

An nScrypt "Smart Pump" is specified to dispense lines down to 50 μm wide and onto conformal surfaces where the angle of the substrate is below 30°. The theoretical track resolution with a "micro pen" system is 100 μm using a 75 μm outer diameter tip, although the narrowest lines produced to date are approximately 230 μm wide using a 175 μm outer diameter tip.

To assist with the materials characterization and process optimization, an Intertronics DK118 Digital Dispenser is used, which is a bench top syringe system using a simple pressure regulator to provide material flow. The output pressure can be set from 1Psi to 100 Psi in increments of 1 Psi and the barrel suck-back feature prevents low viscosity materials from dripping. An I/O port allows the dispenser to be interfaced with external devices. The resolution of this dispensing technique is limited by the size and tolerance of the nozzles available. The nozzles have a stainless steel barrel and it is the outer diameter of this that indicates the width of the track. The track width and height can then advantageously be tailored by varying the offset between the substrate and nozzle or by changing the speed of the motion platform. Similarly, the quality of the starts of tracks can be improved by adjusting the timing between the XY motion start and switching on the pressure.

The offset between the Direct Write tip and the substrate must be maintained during deposition as this influences the track dimensions. If the tip is too high the ink will not flow onto the surface, and if it is too low no ink will flow and there is a danger of damaging the tip. Typically this offset is between 50 μm and 200 μm depending on the width of the track being written. A Keyence LK081 laser displacement sensor is mounted on the Z stage. This laser sensor has a working distance of 80 mm, a 70 μm spot size, a measuring range of ±15 mm and ±3 μm resolution. The accuracy of the height information provided reflects the accuracy of the XY and Z motion stages as well as the accuracy of the displacement sensor.

This system has been found to perform with a greater degree of accuracy and control than expected. The smallest nozzle available for use with the Intertronics syringe has an outer diameter of less than 200 μm, therefore the minimum track width attainable is approximately 200 μm. The digital dispenser takes less time to optimize than the Smart Pump, meaning that it is preferable to the Smart Pump where larger feature sizes are required.

Screen printable inks suitable for direct write require curing following deposition. The curing temperature ranges from around 80° C. to 1000° C. depending on the material composition and curing process. There are three types of ink composition. The first consist of metal particles in a resin matrix. In order to form a conducting layer the metal particles must be fused together. This can only be achieved at high temperatures where the resin burns out, leaving behind a continuous layer of metal. This type can withstand high operating temperatures and are typically used for gas sensors, fuel cells and conductors for actuator blocks. In other ink compositions the polymeric resin is not removed and these are either thermosetting or thermoplastic. The thermoplastic inks do not cure, instead the solvent is driven off by heating, leaving the polymer resin in the binder. The conductivity is due to metal or carbon particles in the resin. These inks cannot withstand high operating temperatures because of the low glass transition temperatures of the resins. The resins in thermosetting inks undergo a cross-linking reacting under temperature than thermoplastic inks.

The curing step limits the scope of the direct write process as many substrate materials are unable to withstand the high processing temperatures. In addition, the size of the oven limits the scale of the structure that can be fabricated using direct write. The direct write process itself can be applied to a varied range and scale of structural components, and so an alternative method of curing would be advantageous.

The resistance requirement for interconnects may be 3.5 Ω/m at 20° C. Inks appropriate for direct writing on structural components generally have low conductivities; therefore larger tracks are needed to give desirable performance. Due to the large dimensions of the tracks required it is more practical to use the Intertronics digital dispenser rather than an nScrypt smart pump. The nScrypt system requires considerable expertise in determining the optimum pump conditions for ink delivery. The digital dispenser takes less time to optimize and the large nozzle sizes available mean that fewer passes are necessary to build up the width.

In order to cure such inks by inductive heating, for efficiency, the coil diameter needs to be similar to the direct write tracks because the coupling efficiency will be proportional to the area of the track overlapped by the coil. So using an example of a 5 mm wide track, the coil diameter needs to be ~5 mm. Note it can be smaller (thus give higher coupling) but this will require multiple passes to cover the full width of the Direct Write tracks. This may be of use where multiple thin lines are employed to form the track, since each pass may cover a single thin line. Another key parameter as recognized by the inventors is the gap between the coil and the surface of the tracks, the coupling being found to fall off very rapidly with increase in this gap. However this loss should be minimized if the gap is kept to <50 microns—note this is made possible as the direct write requires maintaining a gap ~20-30 microns and that has been achieved by the inventors successfully.

As a specific example, based on heating the Direct Write tracks to 2000C, 50% coupling efficiency, coil movement of 1 mm/s, for silver tracks 30 microns thick, the inventors have found that a coil with an electrical power of ~150 W is required. With higher power the processing rate is increased. In the described embodiments, the induction coil used is obtainable from Cheltenham Induction Heating Limited of Saxon Way, Battledown Industrial Estate, Cheltenham, GL526RU Gloucestershire, United Kingdom (email: sales@cihinduction.com, website: www.cihinduction.com).

Referring now to FIG. 4, there is shown a schematic diagram of another print head apparatus 40 for a Direct Write process incorporating an inductive heating coil according to another embodiment of the invention. This embodiment broadly corresponds to that of FIG. 2 and so corresponding reference numerals are used for corresponding parts. Similarly, corresponding parts are not described in further detail in order to avoid repetition. As shown in FIG. 4, the heating system includes an induction coil 6, RF power supply 14 and water chiller 41. The power supply 14 and the water chiller 41 are connected to the coil 6. In this embodiment the coil is a single coil hollow wire of ~20 mm diameter and water from the chiller 41 is directed to flow through the coil 6 so as to prevent it overheating. In the Figure, the component to be heated is placed on the motion system 42 such that it moves in the x-y directions. The base for the component is wooden so that in use it does not contribute to any induction heating indirectly. The coil 6 is positioned typically ~2 mm off the component surface. To effect heating, the component is set in motion and then the induction coil 6 is turned on.

Test samples included direct write tracks of silver printed on alumina, carbon fiber composite, and primer coated aluminum. The tracks were of various lengths and widths, typically ranging from lengths of 100 mm to 150 mm and from widths of 2.5 mm to 5 mm respectively. The track thickness used was typically 20-30 μm . As a temperature indicator temperature indicating liquid (Tempilaq) was placed on a small section of the directly written track—in use, a change of color of the liquid indicated when the temperature had exceeded 120° C. (120° C. is a typical curing temperature used for the thermosetting inks in accordance with the FIG. 4 embodiment).

A summary of results obtained using the apparatus of FIG. 4 with an induction coil from Cheltenham Induction Heating is provided in Table 1.

TABLE 1

| Sample Ref | Dimensions (mm) | Scan conditions | Initial Resistance (Ω) | Final Resistance (Ω) |
|---|---|---|---|---|
| JS230707/1 - Alumina | 6 × 65 | Oven cured reference sample - 110° C. for 10 mins | | 0.5-0.55 |
| JS230707/1 - Alumina | 6 × 65 | 5 mm/s, 600 W (209 A), 370 kHz, 4 scans. On final scan temperature exceeded 120° C. | ~1 | ~0.64 |
| JS230707/1 - Alumina | 6 × 65 | 10 mm/s, 600 W (209 A), 370 kHz, 4scans. Scans done consecutively so accumulative temperature rise. | ~1 | 0.4-0.5 |
| JS230707/1 - Alumina | 6 × 65 | 10 mm/s, 600 W, scans 1-3 sample allowed to cool between scans, very little drop in temperature observed. Scans 4-5 co cooling and resistance dropped. | ~1 | ~0.6 |
| JS230707/1 - Alumina | 6 × 65 | 0.5 mm/s, 200 W (127 A). | ~1 | ~0.24-0.3 |
| Ref CFC sample | 2.5 mm × 135 mm | Cured in the oven for 110° C. for 10 mins. | | 0.45 |
| JS240707/1 | 2.5 mm × 135 mm | 0.5 mm/s, 150 W | 1 | ~0.4 |
| JS270707/4 | 2.5 mm × 135 mm | 5 scans with power increased incrementally from 100 W to 500 W (the effects at lower powers were very small) | 1 | ~0.44 |

These results are thus the results of experiments to ascertain the effects of induction heating. These results show that induction heating can be used effectively to cure directly written tracks, both on insulating materials (alumina) and on conducting materials (CFC, Aluminum) with resistance values of the cured material compatible with the oven cured samples. The results with CFC were found to be successful because it was possible to get good conduction without any visible effects on the CFC.

Whilst the powers used in this example are relatively high, it is to be appreciated that the power levels can be varied, as appropriate—for example, a coil with dimensions matched to the tracks should require only a fraction of the power. Further, it is to be appreciated that for smaller coils water cooling would not be required.

It is to be understood that any feature described in relation to any one embodiment or Example may be used alone, or in combination with other features described, and may also be used in combination with one or more features of any other of the embodiments or Example, or any combination of any other of the embodiments and Example. Further, the person skilled in the art will appreciate that modifications and variations can be made to the embodiments described hereinabove without departing from the scope of the invention.

The invention claimed is:

1. A Direct Write method of forming a component of a structure on a substrate, comprising:
   applying a Direct Write ink onto a predetermined region of the substrate;
   positioning an inductive heating arrangement adjacent to the region having the Direct Write ink applied; and
   passing an electrical current through the inductive heating arrangement such as to heat the region by electromagnetic inductive effects, in order to fix the Direct Write ink; and
   adjusting the height of the inductive heating arrangement above the Direct Write ink applied to control the amount of magnetic flux applied to the substrate during heating.

2. The method according to claim 1, wherein the Direct Write ink is applied in the form of at least one line and the magnetic flux produced by the inductive heating arrangement has an effective diameter at the substrate generally equal to the width of one of the at least one lines.

3. The method according to claim 1 or 2, wherein the inductive heating arrangement is arranged to heat one or more of the deposited ink, the substrate in the region, and a further component in the region.

4. The method according to claim 3, wherein the Direct Write ink is seeded with a conductive article including at least one of carbon and a metal, wherein the conductive article is sufficient to permit heating by electromagnetic inductive effects.

5. The method according to claim 2, wherein the width of the at least one line is less than about 5 mm.

6. The method according to claim 5, wherein the at least one line is formed by a plurality of thinner lines, positioned side by side.

7. The method according to claim 2, 5 or 6, wherein the at least one line forms an electrical interconnect.

8. The method according to claim 1, wherein the Direct Write ink is applied in the form of a line or a plurality of lines.

9. The method according to claim 8, wherein the height of the inductive heating arrangement above the substrate is adjusted in response to monitoring a capacitance between the inductive heating arrangement and the deposited Direct Write ink.

10. The method according to claim 1 or 8, wherein the current passing through the inductive heating arrangement is monitored for controlling the heating of the Direct Write ink.

11. The method according to claim 1 or 8, wherein the rate of application of the Direct Write ink is controlled in order to control the heating by the inductive heating arrangement.

12. An additive manufacturing process for forming a structure by depositing a plurality of layers on a substrate, wherein at least one layer in the manufacturing process is formed by the Direct Write method according to claim 1 or 8.

13. An apparatus for a Direct Write process of forming a component on a substrate, comprising:
   an ink deposition arrangement for applying a Direct Write ink onto a region of a substrate; and an inductive heating arrangement for positioning adjacent the region such as to heat the region by electromagnetic inductive effects, in order to fix the Direct Write ink;

wherein the inductive heating arrangement includes an arrangement for adjusting the height of the inductive heating arrangement above the substrate during heating.

14. The apparatus according to claim 13, wherein the ink deposition arrangement applies the Direct Write ink in the form of at least one line, and the magnetic flux produced by the inductive heating arrangement has an effective diameter at the substrate generally equal to the width of one of the at least one lines.

15. The apparatus according to claim 13 or 14 wherein the height of the inductive heating arrangement above the Direct Write ink applied is predetermined.

16. The apparatus according to claim 13, wherein the ink deposition arrangement applies the Direct Write ink in the form of a line or a plurality of lines, and the arrangement for adjusting the height of the inductive heating arrangement adjusts the height in response to monitoring a capacitance between the inductive heating arrangement and the deposited Direct Write ink.

17. The apparatus according to claim 13, 14 or 16, wherein the rate of application of the Direct Write ink is controlled in order to control the heating by the inductive heating arrangement.

18. The apparatus according to claim 13, 14 or 16, wherein an inductive heating coil is attached to the ink deposition arrangement for depositing ink.

19. The apparatus according to claim 13, 14 or 16, wherein an inductive heating coil is provided, separate from the ink deposition arrangement, for a subsequent heating of the region.

20. The apparatus according to claim 14, wherein the inductive heating arrangement comprises cylindrical induction coil, having an end for positioning above a the line for providing magnetic flux thereto.

21. A method of forming a component of a structure on a substrate, comprising:

applying an ink onto a predetermined region of the substrate;

positioning an inductive heating arrangement adjacent to the region having the ink applied, and passing an electrical current through the inductive heating arrangement such as to heat the region by electromagnetic inductive effects, in order to fix the ink; and adjusting the height of the inductive heating arrangement above the ink applied to control the amount of magnetic flux applied to the substrate during heating.

22. The method according to claim 21, wherein the ink is applied in the form of at least one line, and the magnetic flux produced by the inductive heating arrangement has an effective diameter at the substrate generally equal to the width of one of the at least one lines.

23. The method according to claim 21, wherein the ink is applied in the form of a line or a plurality of lines.

24. An apparatus for a process of forming a component on a substrate, comprising:

an ink deposition arrangement for applying an ink onto a region of a substrate; and an inductive heating arrangement for positioning adjacent the region such as to heat the region by electromagnetic inductive effects, in order to fix the ink;

wherein the inductive heating arrangement includes an arrangement for adjusting the height of the inductive heating arrangement above the substrate during heating.

25. The apparatus according to claim 24, wherein the ink deposition arrangement applies the ink in the form of at least one line, and the magnetic flux produced by the inductive heating arrangement has an effective diameter at the substrate generally equal to the width of one of the at least one lines.

26. The apparatus according to claim 24, wherein the ink deposition arrangement applies the ink in the form of a line or a plurality of lines, and the arrangement for adjusting the height of the inductive heating arrangement adjusts the height in response to monitoring a capacitance between the inductive heating arrangement and the deposited ink.

27. A Direct Write method of forming a component of a structure on a substrate, the method comprising:

applying a Direct Write ink onto a predetermined region of the substrate;

positioning an inductive heating arrangement adjacent to the region having the Direct Write ink applied; and passing an electrical current through the inductive heating arrangement such as to heat the region by electromagnetic inductive effects, in order to fix the Direct Write ink;

wherein the Direct Write ink is applied in the form of a line or a plurality of lines, and wherein the height of the inductive heating arrangement above the Direct Write ink applied is adjusted in response to monitoring a capacitance between the inductive heating arrangement and the deposited Direct Write ink, so as to control the amount of magnetic flux applied to the substrate.

28. An apparatus for a Direct Write process of forming a component on a substrate, comprising:

an ink deposition arrangement for applying a Direct Write ink onto a region of a substrate; and an inductive heating arrangement for positioning adjacent the region such as to heat the region by electromagnetic inductive effects, in order to fix the Direct Write ink;

wherein the ink deposition arrangement applies the Direct Write ink in the form of a line or a plurality of lines, and wherein the inductive heating arrangement includes an arrangement for adjusting the height of the inductive heating arrangement above the substrate in response to monitoring a capacitance between the inductive heating arrangement and the deposited Direct Write ink.

29. An apparatus for a process of forming a component on a substrate, comprising:

an ink deposition arrangement for applying an ink onto a region of a substrate; and an inductive heating arrangement for positioning adjacent the region such as to heat the region by electromagnetic inductive effects, in order to fix the ink;

wherein the ink deposition arrangement applies the ink in the form of a line or a plurality of lines, and wherein the inductive heating arrangement includes an arrangement for adjusting the height of the inductive heating arrangement above the substrate in response to monitoring a capacitance between the inductive heating arrangement and the deposited ink.

* * * * *